(12) United States Patent
Kobayashi et al.

(10) Patent No.: US 7,996,794 B2
(45) Date of Patent: Aug. 9, 2011

(54) MASK DATA PROCESSING METHOD FOR OPTIMIZING HIERARCHICAL STRUCTURE

(75) Inventors: Sachiko Kobayashi, Ichikawa (JP); Toshiya Kotani, Machida (JP); Shinichiroh Ohki, Kawasaki (JP); Hirotaka Ichikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 669 days.

(21) Appl. No.: 11/945,697

(22) Filed: Nov. 27, 2007

(65) Prior Publication Data
US 2008/0216045 A1 Sep. 4, 2008

(30) Foreign Application Priority Data
Nov. 28, 2006 (JP) ................... 2006-320343

(51) Int. Cl.
*G06F 17/50* (2006.01)
(52) U.S. Cl. ........................................................ 716/51
(58) Field of Classification Search .............. 716/19–21, 716/50–56
See application file for complete search history.

(56) References Cited

U.S. PATENT DOCUMENTS

| | | | | |
|---|---|---|---|---|
| 5,663,893 A | * | 9/1997 | Wampler et al. | 716/19 |
| 5,885,734 A | * | 3/1999 | Pierrat et al. | 716/19 |
| 6,047,116 A | * | 4/2000 | Murakami et al. | 716/54 |
| 6,370,679 B1 | * | 4/2002 | Chang et al. | 716/19 |
| 6,637,010 B2 | | 10/2003 | Yamamoto | |
| 6,868,537 B1 | * | 3/2005 | Ho et al. | 716/19 |
| 7,194,704 B2 | | 3/2007 | Kotani et al. | |
| 2001/0016937 A1 | * | 8/2001 | Watanabe | 716/19 |
| 2002/0038445 A1 | | 3/2002 | Yamamoto | |
| 2003/0188288 A1 | | 10/2003 | Kobayashi et al. | |
| 2007/0124718 A1 | | 5/2007 | Kobayashi et al. | |

FOREIGN PATENT DOCUMENTS

| | | |
|---|---|---|
| JP | 2005-181524 | 7/2005 |
| JP | 2006-235184 | 9/2006 |

* cited by examiner

*Primary Examiner* — Jack Chiang
*Assistant Examiner* — Brandon W Bowers
(74) *Attorney, Agent, or Firm* — Finnegan, Henderson, Farabow, Garrett & Dunner, L.L.P.

(57) ABSTRACT

Disclosed is a mask data processing method of correcting a hierarchical structure. In the case that in design data having a hierarchical structure including a plurality of cells each having a design pattern, when the total number of graphic forms or the total edge length of a design pattern on which the calculation of mask data processing is to be executed, the amount of calculation to be executed, or the expansion degree presumably becomes equal to or larger than a predetermined threshold value if the calculation of the mask data processing is executed on the design data having the initial hierarchical structure, the hierarchical structure is corrected. This correction is performed to reduce the total number of graphic forms or the total edge length of the design pattern on which the calculation is to be executed, the amount of calculation to be executed, of the expansion degree.

5 Claims, 12 Drawing Sheets

| Test pattern | Number of times of repetitions of critical patterns | Calculation amount in conventional mask data processing method (arbitrary unit) | Calculation amount in mask data processing method according to this embodiment (arbitrary unit) | Calculation amount reduction ratio |
|---|---|---|---|---|
| Small scale | 10~ | 53,212 | 34,278 | 36% |
| Medium scale | 200 | 543,230 | 94,277 | 83% |
| Large (product) scale | 1100 | 209,598 | 104,864 | 50% |

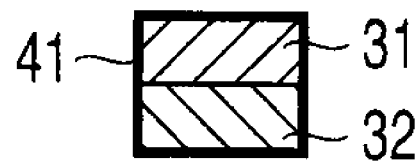
F I G. 1 1
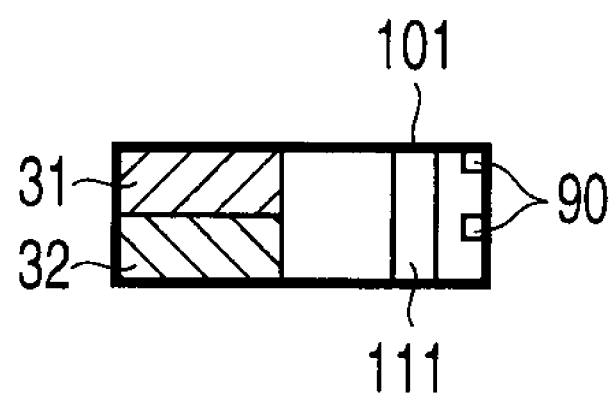
F I G. 1 2

MASK DATA PROCESSING METHOD FOR OPTIMIZING HIERARCHICAL STRUCTURE

CROSS-REFERENCE TO RELATED APPLICATIONS

This application is based upon and claims the benefit of priority from prior Japanese Patent Application No. 2006-320343, filed Nov. 28, 2006, the entire contents of which are incorporated herein by reference.

BACKGROUND OF THE INVENTION

1. Field of the Invention

The present invention relates to design layout formation and a mask data processing method for fabricating a semiconductor integrated circuit. More specifically, the present invention relates to a mask data processing method for optimizing a hierarchical structure.

2. Description of the Related Art

When shipping design data in semiconductor fabrication, various verifications are performed to confirm the correctness of the data.

For example, a design rule check is performed to verify whether design rules are satisfied. The design rules are basic design agreements determined on the basis of the device conditions and process conditions, and concerning the minimum dimension, space, shape, and the like.

Other examples are verifications using a difference check for checking whether a difference from previous data is produced in an unexpected portion, a shape check, circuit simulation, and process simulation.

Design data having passed these verifications is taped out as data from which no problem is detected by the regular test, and supplied to mask data processing.

On the other hand, as the semiconductor design rules become finer and the processes become complicated in recent years, the rules and contents of the mask data processing become more and more complicated in particularly critical layers that are very fine and have high process difficulties (e.g., Jpn. Pat. Appln. KOKAI Publication No. 2005-181524).

Examples are optical proximity correction, insertion of an auxiliary pattern equal to or smaller than a resolution limit, dummy pattern insertion, and shifter generation and placement of a phase shift mask. The load and calculation cost of the formation of the mask data processing rules keep on increasing.

In the verifications performed before design data to be supplied to the mask data processing is taped out, it is very difficult to predict the sizes of intermediate data/processed data in the mask data processing, and the process time of the mask data processing.

For example, even when design data is found to have a correct shape, if the hierarchical structure of this design data does not match the mask data processing tool, the process time or the intermediate data/processed data sizes may unexpectedly increase. This may cause a schedule delay or abnormal termination of the processing resulting from an insufficient data storage area.

When the cause of an inconvenience such as an abrupt increase in process time of the mask data processing is checked, it is sometimes found that the hierarchical structure of a memory cell array or the like is not held but expanded in hierarchical processing of the mask data processing. A memory cell array and its peripheral portion have very large numbers of repetitions. If the hierarchy is expanded, therefore, the data size enormously increases. Especially when a region such as a high-precision OPC (Optical Proximity Correction) region requiring a large calculation amount for processing is expanded, the calculation amount significantly increases. As a consequence, the process turn around time worsens.

An inconvenience caused by the hierarchical structure as described above is often overlooked because it hardly comes up to the surface even when design data of a very small region is checked through the mask data processing as a test. Therefore, the inconvenience reveals itself for the first time in the stage of the mask data processing. Correcting this inconvenience requires rearrangement of the process machine, rescheduling, and reformation and reverification of the design data, and these works require much labor and time. Especially when the hierarchical structure of the design data is manually corrected, the operation is very time-consuming, and errors readily occur. This further delays the schedule and increases the cost.

Also, the size of a fringe region in the hierarchical processing increases depending on the operation method of the mask data processing. The fringe region is a region for which a graphical operation is repetitively performed in order to take account of the surrounding layout, and which is discarded after that. If a portion corresponding to this fringe region includes a region such as a high-precision OPC region requiring a large calculation amount for processing, this processing requiring a large calculation amount is repetitively executed, so the process time increases.

In the fabrication of a semiconductor device, the increase in cost caused by the delay of the schedule is serious. That is, the machine resources must be given an excessive margin in order to hold an appropriate turn around time according to a predetermined schedule. Accordingly, the increase in cost in preparation for the infrastructure of the mask data processing increases the overall cost of the mask data processing.

BRIEF SUMMARY OF THE INVENTION

A mask data processing method according to the first aspect of the present invention is a mask data processing method for generating mask data, wherein, when a repetitive design data region having an identical design pattern satisfies a predetermined condition based on recommended pattern structure indices, a result of mask data processing calculation executed for a design pattern contained in one of the repetitive design data regions is applied to the repetitive design data regions for which mask data calculation processing is not executed, without performing the mask data processing calculation, the mask data processing method comprising determining whether or not a repetitive design data region included in prepared design data and having an identical design pattern satisfies the predetermined condition, and restructuring the repetitive design data region in such a manner as to satisfy the predetermined condition, unless the predetermined condition is satisfied.

A mask data processing method according to the second aspect of the present invention is a mask data processing method for generating mask data, wherein, when a plurality of repetitive design data regions having an identical design pattern satisfy a predetermined condition based on recommended cell structure indices with respect to design data including a plurality of cells each having a design pattern, a result of mask data processing calculation executed for a design pattern contained in one of the repetitive design data regions is applied to the repetitive design data regions for which mask data calculation processing is not executed, without performing the mask data processing calculation, the mask data processing method comprising when a plurality of critical cells having an identical critical design pattern are arranged in a repeating direction the number of times not less than the predetermined number of times of repetition, a width as defined in a direction perpendicular to the repeating direction of the critical cells is less than the predetermined width, and the critical cells are adjacent, in one direction perpendicular to the repeating direction, to the same adjacent design pattern requiring a smaller calculation amount per unit area than a calculation amount required of the critical design pattern, when the calculation of the mask data processing is executed, performing correction to increase a width of one side of the critical cells such that the critical cell includes the adjacent design pattern adjacent thereto, and the width as defined in the direction perpendicular to the repeating direction of the critical cell is not less than the predetermined width, and executing the calculation of the mask data processing after the performing correction.

A mask data processing method according to the third aspect of the present invention is a mask data processing method, wherein design data is divided into a plurality of cells each having a design pattern, each of the cells has a fringe region which is adjacent to and in contact with an outer circumference thereof, and calculation of mask data processing is performed on each cell such that the calculation is also executed in the fringe region of the cell, thereby generating mask data, the mask data processing method comprising changing the division to move or change the fringe region such that a calculation amount of the mask data processing in the fringe region after the division is changed is made smaller than a calculation amount of the mask data processing in the fringe region before the division is changed, and executing the calculation of the mask data processing after the division is changed.

BRIEF DESCRIPTION OF THE SEVERAL VIEWS OF THE DRAWING

FIG. 11 is a view showing an uncorrected cell;

FIG. 12 is a view showing a corrected cell according to the second embodiment of the present invention;

DETAILED DESCRIPTION OF THE INVENTION

First Embodiment

A mask data processing method according to the first embodiment of the present invention will be explained below with reference to FIGS. 1 to 8.

Design data of a semiconductor integrated circuit is generally made up of design data basic units called cells, and has a hierarchical structure made up of the cells. When storing design data as information, therefore, design pattern information defined in a cell, and, if identical cells are arranged in a plurality of portions in the layout or repetitively arranged, pattern information and hierarchical structure information pertaining to the repetition and arrangement are stored as a set.

Figure 1:
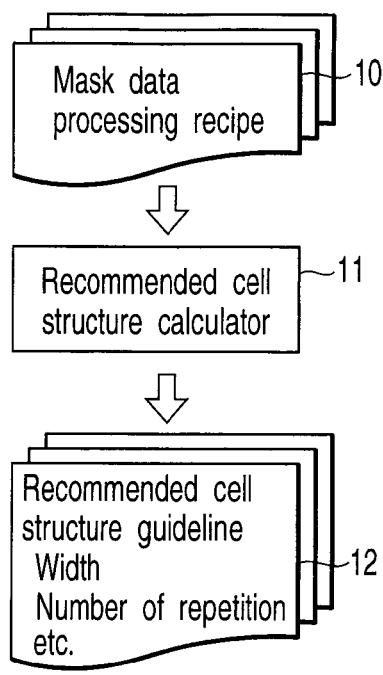
FIG. 1 is a view showing the way recommended cell structure indices are obtained from a mask data processing recipe in the first embodiment of the present invention.

In this embodiment, as shown in FIG. 1, a mask data processing recipe 10 is input to a recommended cell structure calculator 11 to obtain output recommended pattern structure indices (recommended cell structure indices, for example) 12.

The mask data processing recipe 10 describes a practical method of the process of generating mask data. More specifically, the mask data processing recipe 10 indicates the contents of processes of, e.g., reading out predetermined layers from design data, performing a graphical operation (Boolean operation) such as addition, subtraction, an AND operation, a NOT operation, or an XOR operation, extracting a predetermined pattern (a line, space, rectangle, or line end having a predetermined size), performing a predetermined process (e.g., widening, narrowing, or extending), generating an auxiliary pattern and dummy pattern in predetermined portions, performing an OPC process in the predetermined portions, and removing predetermined micropatterns.

The recommended cell structure indices 12 indicate the indices of a cell arrangement that can be recommended as the hierarchical structure of design data that can be efficiently processed in later mask data processing. More specifically, for a cell block in which one or a plurality of cells having the same design pattern are repetitively arranged, for example, the recommended cell structure indices 12 indicate that the width of a cell in a direction perpendicular to the repeating direction is A µm or more as a recommended cell size, and the number of repetitions of the cell is B or more as a recommended number of times of cell repetition.

Figure 2:
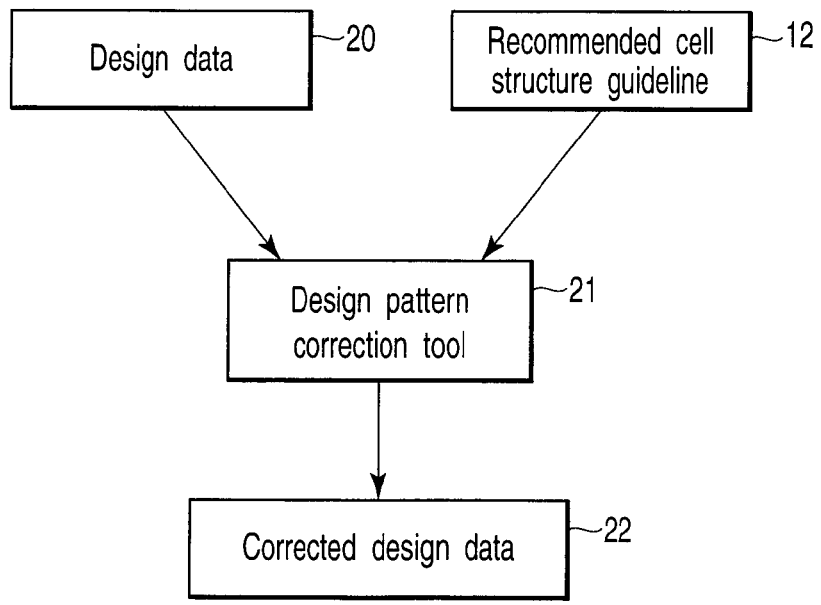
FIG. 2 is a view showing the input/output relationship of a design pattern correction tool in the first embodiment of the present invention.

Then, as shown in FIG. 2, corrected design data 22 is obtained by inputting design data 20 and the recommended cell structure indices 12 to a design pattern correction tool 21.

Figure 3:
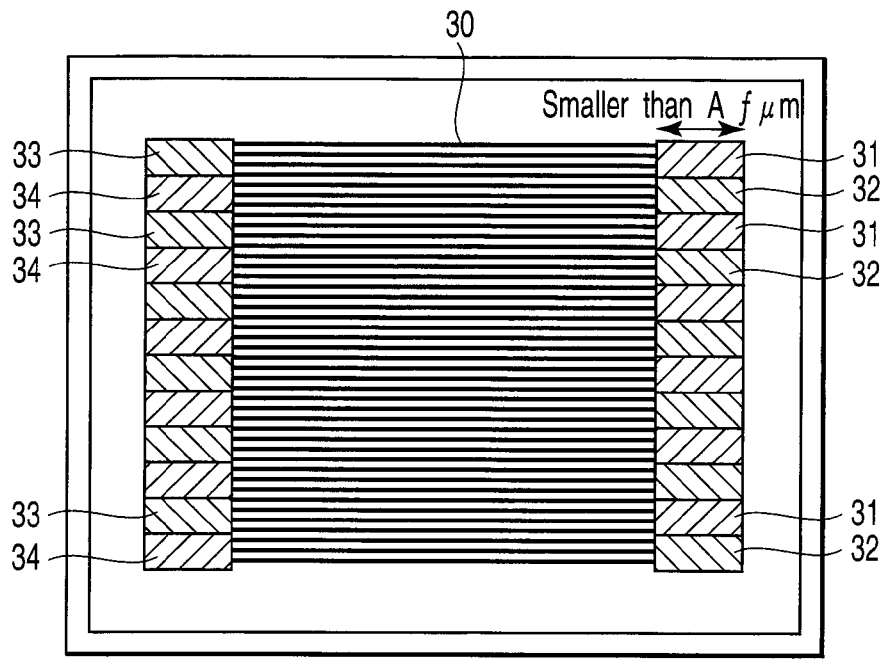
FIG. 3 is a plan view showing the arrangement of design data according to the first embodiment of the present invention.

The design data 20 is design data released through normal verifications, e.g., small-scale test pattern data as shown in FIG. 3. A central line pattern is obtained by arranging, e.g., 100 line patterns 30. Fine critical patterns 31, 32, 33, and 34 having a high process difficulty are concentrated in regions on the two sides. In these regions, the calculation amount per unit area is large because OPC calculations are necessary in later mask data processing. More specifically, a necessary calculation amount per unit area is sometimes a few ten thousand times or more as large as that for the line pattern 30 and the like requiring only the Boolean operation.

The critical patterns 31 and 32 are, e.g., mirror-symmetric patterns, and identical sets of patterns 31 and 32 are vertically repeated B times or more. Similarly, the critical patterns 33 and 34 are also mirror-symmetric patterns, and identical sets of patterns 33 and 34 are vertically repeated B times or more. The width of the critical patterns 31, 32, 33, and 34 is smaller than A µm.

Figure 4:
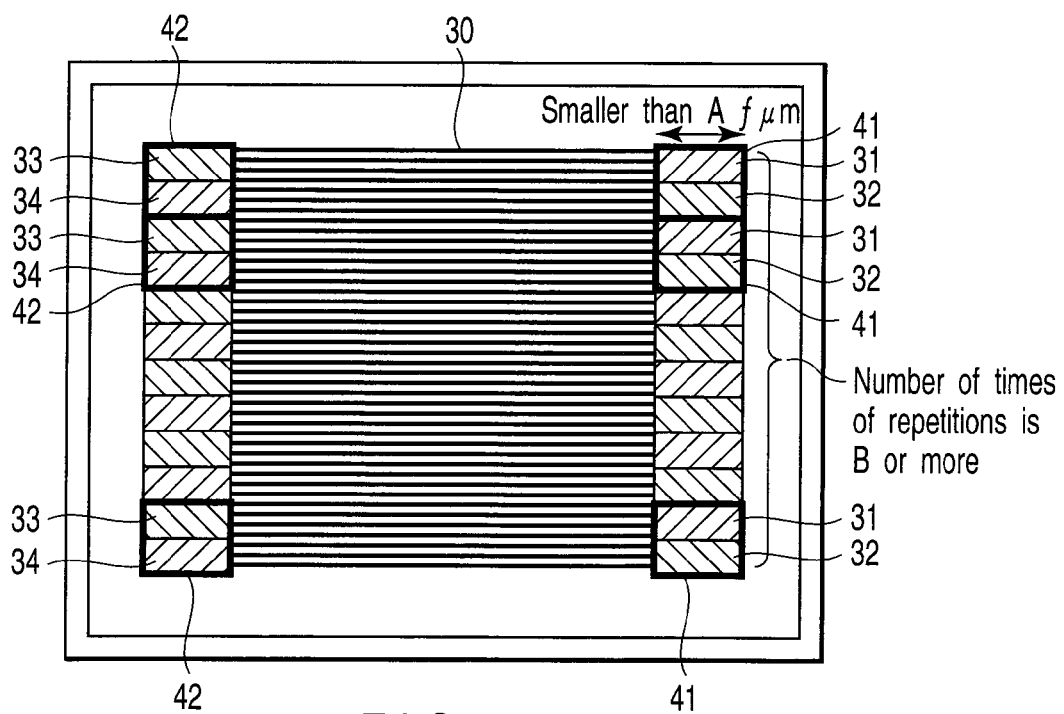
FIG. 4 is a plan view showing the hierarchical structure of the design data according to the first embodiment of the present invention.

Accordingly, as shown in FIG. 4, information of the initial design data 20 contains information of the line pattern 30, information of a critical cell 41 including patterns 31 and 32, information of a critical cell 42 including patterns 33 and 34, and hierarchical information concerning the repetition of these cells.

Figure 5:
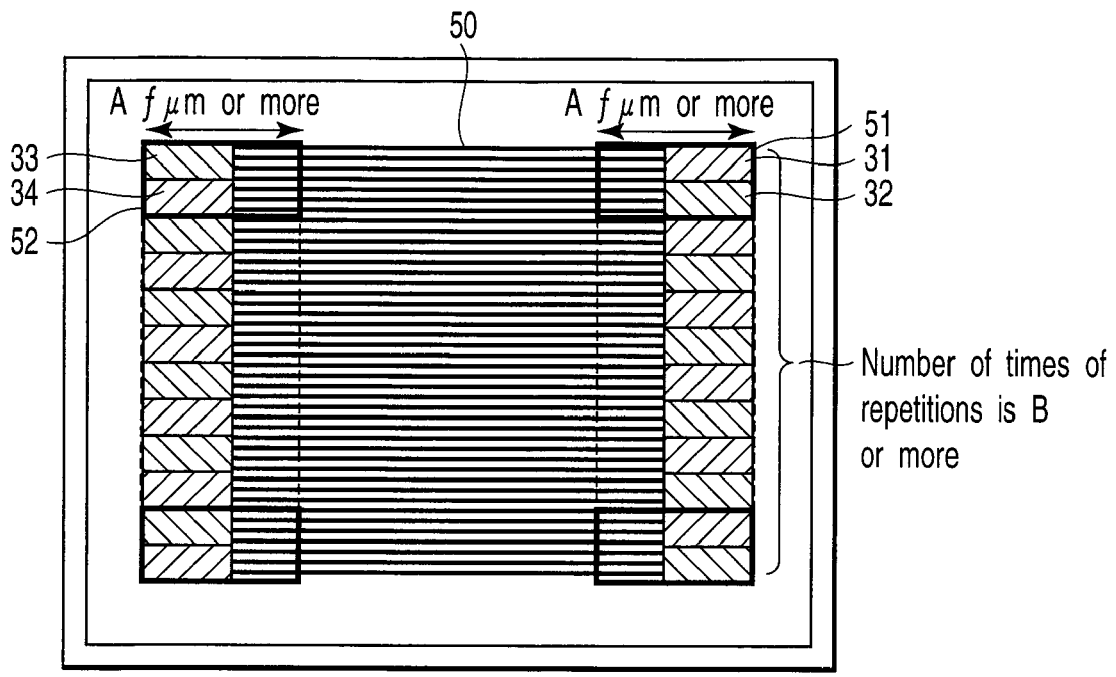
FIG. 5 is a plan view showing the hierarchical structure of corrected design data according to the first embodiment of the present invention.

The corrected design data 22 obtained by inputting the design data 20 as described above and the recommended cell structure indices 12 to the design pattern correction tool 21 has a hierarchical structure shown in FIG. 5.

FIG. 5 shows that a cell 50 as a single line pattern, a cell 51 formed by patterns 31 and 32 and portions of the line patterns, and a cell 52 formed by patterns 33 and 34 and portions of the line patterns are repetitive patterns. The number of repetitions of cells 51 and 52 is B or more. In accordance with the recommended cell structure indices 12, however, the width of cells 51 and 52 is A µm or more that is larger than that of cells 41 and 42 shown in FIG. 4.

Accordingly, information of the corrected design data 22 contains information of each of cells 50, 51, and 52, and hierarchical information concerning the repetition of these cells. That is, the critical patterns 31, 32, 33, and 34 requiring a large calculation amount in the mask data processing shown in FIG. 3 form an array region in which the width is A µm or more and the number of repetitions is B or more in accordance with the recommended cell structure indices 12.

Hierarchical processing is performed as a stage before the mask data processing according to this embodiment. The hierarchical processing expands and reconstructs the hierarchical structure of design data in consideration of the contents of the mask data processing, i.e., the contents of the Boolean operation, sizing amount, OPC process, and RET process. That is, the threshold values such as the width and the number of repetitions of the cell to be expanded by the hierarchical processing depend on the contents of the mask data processing.

More specifically, when one or a plurality of cells having the same design pattern are arranged in one direction the number of times equal to or larger than B predetermined on the basis of the contents of the mask data processing, and the width of the cell in a direction perpendicular to the direction in which one or the plurality of cells are arranged is equal to or larger than A µm predetermined on the basis of the contents of the mask data processing, the hierarchical processing is performed such that the calculation of the mask data processing can be executed on only design patterns contained in one or a minimum number of cells of the repetitively arranged cells.

Note that the recommended cell structure indices 12 described above are the indices of a cell arrangement that can be recommended as the hierarchical structure of design data that can be efficiently processed in the mask data processing. As a consequence, the recommended cell structure indices 12 directly reflect the threshold values such as the width and the number of repetitions of the cells in the hierarchical processing.

Figure 6:
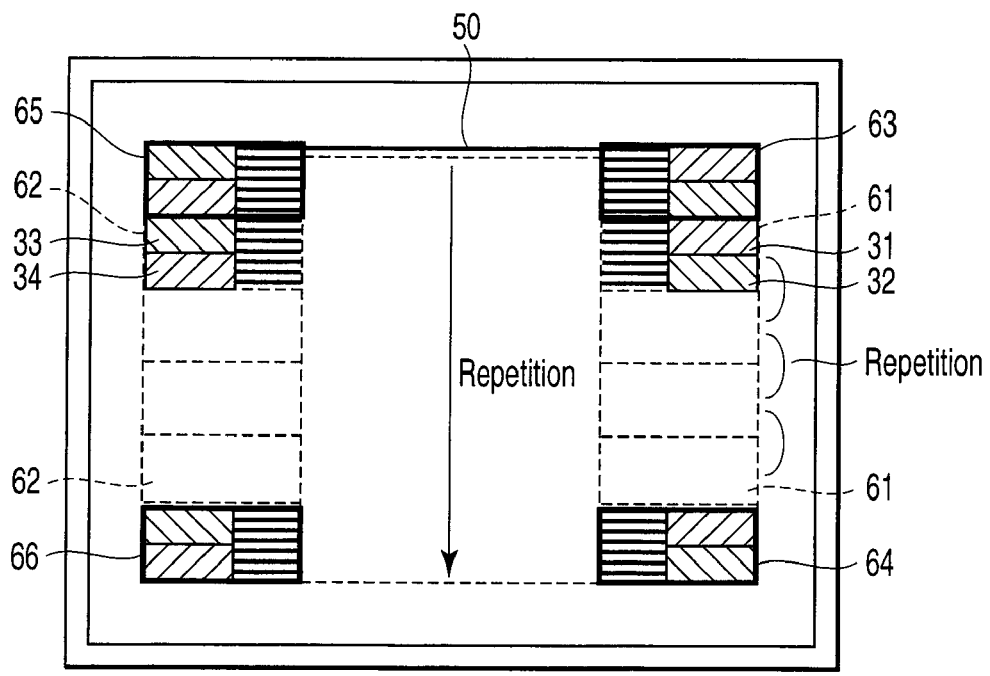
FIG. 6 is a view showing the calculation of mask data processing using repetition in the hierarchical structure of the corrected design data according to the first embodiment of the present invention.

When the corrected design data 22 described above was directly supplied to the mask data processing, therefore, it was possible to perform the calculation of the mask data processing using repetition as shown in FIG. 6 by performing the hierarchical processing as the preprocessing of the mask data processing, i.e., performing the process of reconstructing the hierarchical structure of the corrected design data 22 shown in FIG. 5 for the operation in the mask data processing.

As shown in FIG. 6, the mask data processing executes a calculation once for each of repetitive patterns, i.e., cell 50 as a single line pattern, a cell 61 formed by patterns 31 and 32 and portions of the line patterns, and a cell 62 formed by patterns 33 and 34 and portions of the line patterns.

That is, the correction of the hierarchical structure of design data according to this embodiment makes it possible to largely reduce the calculations executed on the critical patterns 31, 32, 33, and 34 requiring a large calculation amount in the mask data processing. Note that no repetition can be used for cells 63, 64, 65, and 66 because they exist in the corners and hence the peripheral pattern arrangements are different. Assume that the number of repetitions of cells 61 and 62 is B or more even when cells 63, 64, 65, and 66 are removed from the array region.

Figures 7, 8:
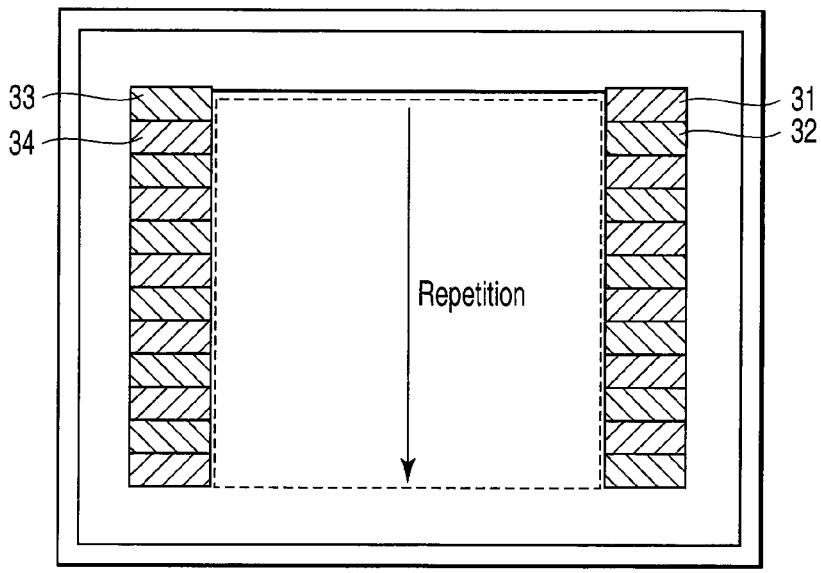
FIG. 7 is a view showing the calculation of mask data processing using repetition in the hierarchical structure of the original design data shown in FIG. 4.
FIG. 8 is a view showing the reduction amount of a calculation amount in a mask data processing method according to the first embodiment of the present invention, when compared to the conventional method.

On the other hand, the calculation of the mask data processing is executed as shown in FIG. 7 if the original design data 20 having the hierarchical structure shown in FIG. 4 is directly supplied to the mask data processing without using the design pattern correction tool 21 as in the conventional method.

That is, repetition can be used for the line pattern 30 alone as a result of the hierarchical processing in the mask data processing tool. Since the width of cells 41 and 42 is smaller than A µm as the threshold value, the processing is performed by completely expanding the one-dimensional array of cells 41 and 42 into a flat state as shown in FIG. 7. Consequently, the calculation of the mask data processing is performed on all regions of patterns 31, 32, 33, and 34 requiring a large calculation amount as well, without using any pattern repetition.

Accordingly, it was possible to largely reduce the calculation amount in the mask data processing by effectively using repetition by using the design data corrected by this embodiment, compared to uncorrected design data used in the conventional method. In the case of small-scale test patterns as in this embodiment, the reduction ratio of the calculation amount was about 36% as shown in, e.g., FIG. 8.

Similarly, medium-scale test pattern data and product-scale test pattern data were also designed by using recommended cell structure indices as explained in this embodiment, and the calculation amounts of these data in the mask data processing were compared with those of data formed by the conventional design method. Consequently, as shown in FIG. 8, it was possible to obtain the calculation amount reducing effect corresponding to the number of times of pattern repetition and the degree of expansion of the hierarchy.

Second Embodiment

A mask data processing method according to the second embodiment of the present invention will be explained below. In this embodiment, FIG. 9 shows an example in which the cell structure of design data 20 shown in FIG. 4 is automatically corrected on the basis of recommended cell structure indices 12.

When a mask data processing recipe 10 was input to a recommended cell structure calculator 11 shown in FIG. 1 in the same manner as in the first embodiment, the recommended cell structure indices 12 indicated that the cell width was A μm or more and the number of repetitions was B or more.

As shown in FIG. 2, when the design data 20 and recommended cell structure indices 12 are input to a design pattern correction tool 21, the design pattern correction tool 21 makes the cell size larger than A. As shown in FIG. 9, therefore, cells 91 and 92 are formed by enlarging existing cells 41 and 42 to the outsides where no pattern exists.

Figure 9:
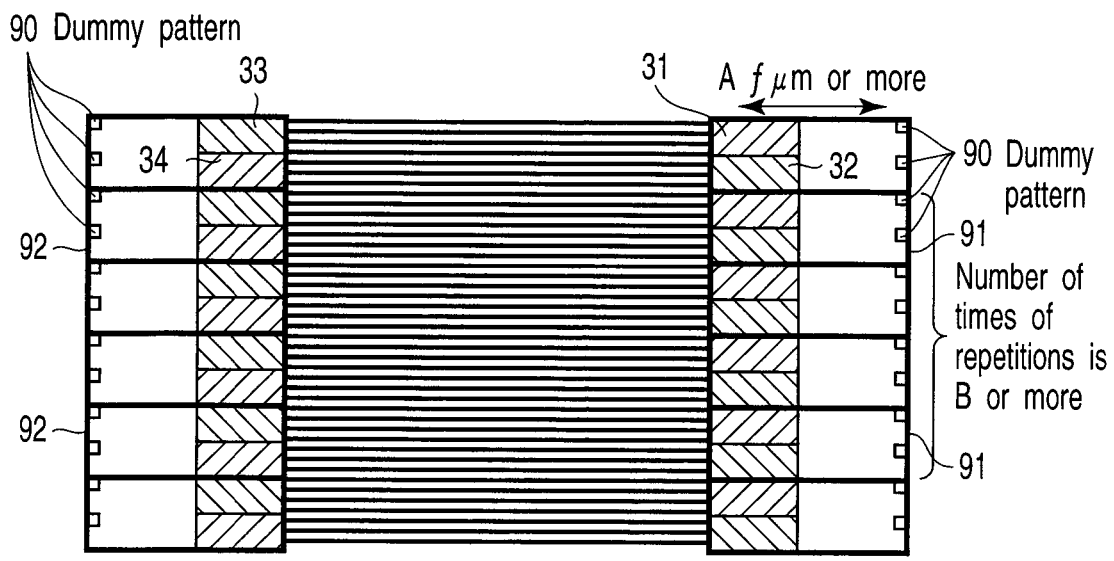
FIG. 9 is a plan view showing the hierarchical structure of design data corrected by using dummy patterns according to the second embodiment of the present invention.

More specifically, dummy patterns 90 defining the contours of cells 91 and 92 are generated in positions where the cell dimension is A μm or more as shown in FIG. 9, and cells 91 and 92 are reconstructed to include the dummy patterns 90. The calculation amount per unit area in mask data processing in the region newly included in cells 91 and 92 enlarged to contain the dummy patterns 90 is naturally much smaller than that of critical patterns 31, 32, 33, and 34.

The design pattern correction tool 21 performs the above correction on the design data. In the mask data processing, therefore, the calculation of the mask data processing is executed only once for each of cells 91 and 92 as repetitive patterns. This makes it possible to largely reduce the calculation amount of the critical patterns 31, 32, 33, and 34 requiring a large calculation amount per unit area.

Figure 10:
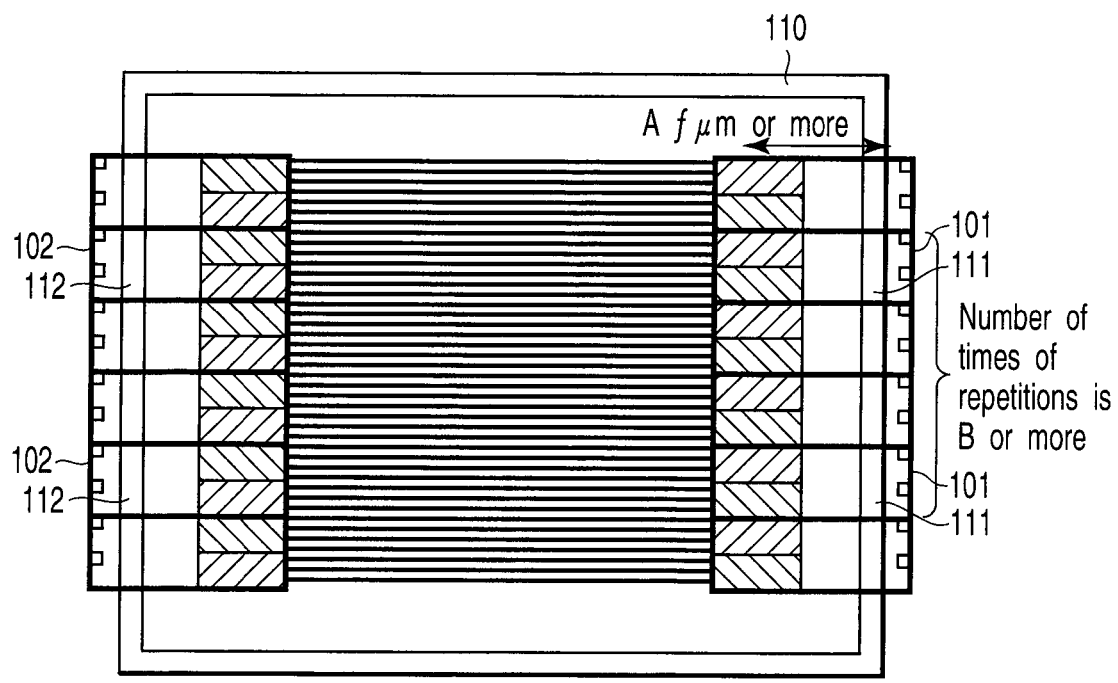
FIG. 10 is a plan view showing the hierarchical structure of another design data corrected by using the dummy patterns according to the second embodiment of the present invention.

Another example of this embodiment is the case that the cell contour overlaps another pattern 110 as shown in FIG. 10 when the cell dimension is increased outward such that the width is A μm or more in order to satisfy the recommended cell structure indices 12. In this case, the shapes of pattern 110 contained in extended cells 101 and 102 were analyzed. If the shapes were equal in cells 101 and 102, patterns 111 and 112 were formed by dividing pattern 110 into cell sizes, and cells were reconstructed such that cells 101 and 102 respectively contained patterns 111 and 112.

That is, original cell 41 shown in FIG. 11 was extended to cell 101 having frame pattern 111 embedded in it and including dummy pattern 90 for defining the cell contour. Consequently, the mask data processing calculation using pattern repetition was executed in the mask data processing. This made it possible to largely reduce the calculation amount of critical patterns 31, 32, 33, and 34.

Third Embodiment

A mask data processing method according to the third embodiment of the present invention will be explained below with reference to FIGS. 13 to 15. In the mask data processing method according to this embodiment, the case that mask data processing is performed on design data 130 shown in FIG. 13 having a one-dimensional array structure in the longitudinal direction will be explained.

Figure 13:
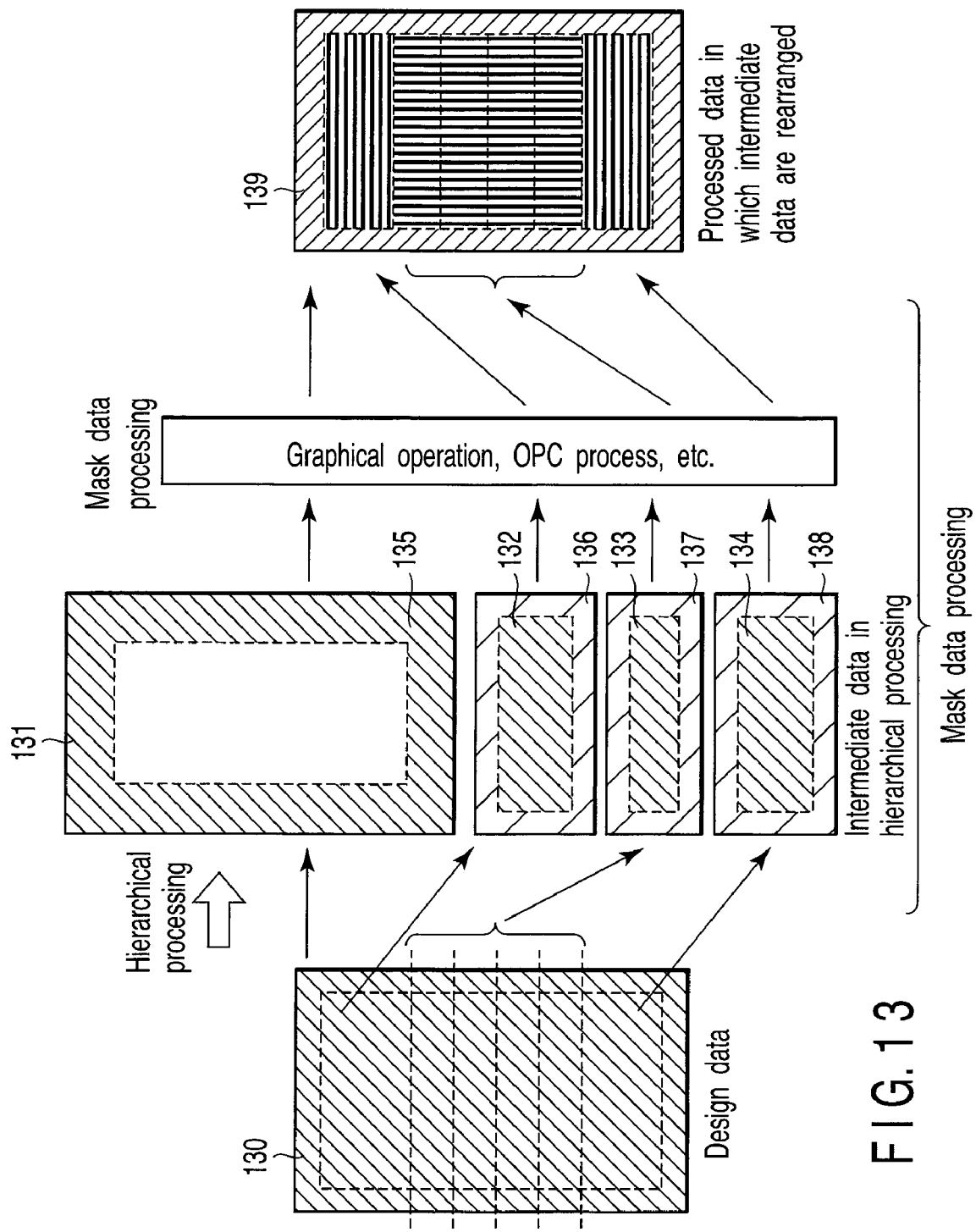
FIG. 13 is a view showing the sequence of mask data processing according to the third embodiment of the present invention by focusing on the arrangement of intermediate data in hierarchical processing as preprocessing.

As shown in FIG. 13, hierarchical processing as preprocessing of the mask data processing divides the design data 130 into a donut-like region 131 and intermediate cells 132, 133, and 134. In addition, regions where the calculation of the mask data processing is repetitively performed in order to take account of the influence of the surrounding layout, i.e., fringe regions 135, 136, 137, and 138 are respectively attached to donut-like region 131 and intermediate cells 132, 133, and 134, thereby forming intermediate data. Fringe regions 135 to 138 are regions which are added to introduce the influence of, e.g., the optical proximity effect from the peripheral region and in which the calculation of the mask data processing must be performed.

After that, the mask data processing including, e.g., a graphical operation and OPC process is performed on each intermediate data. Fringe regions 135 to 138 are removed from the processed data, and the data are rearranged to form processed data 139. Although the fringe region is cut away after the calculation, the fringe region is necessary to more accurately execute the calculation of the mask data processing on a region surrounded by the fringe region.

Figure 14:
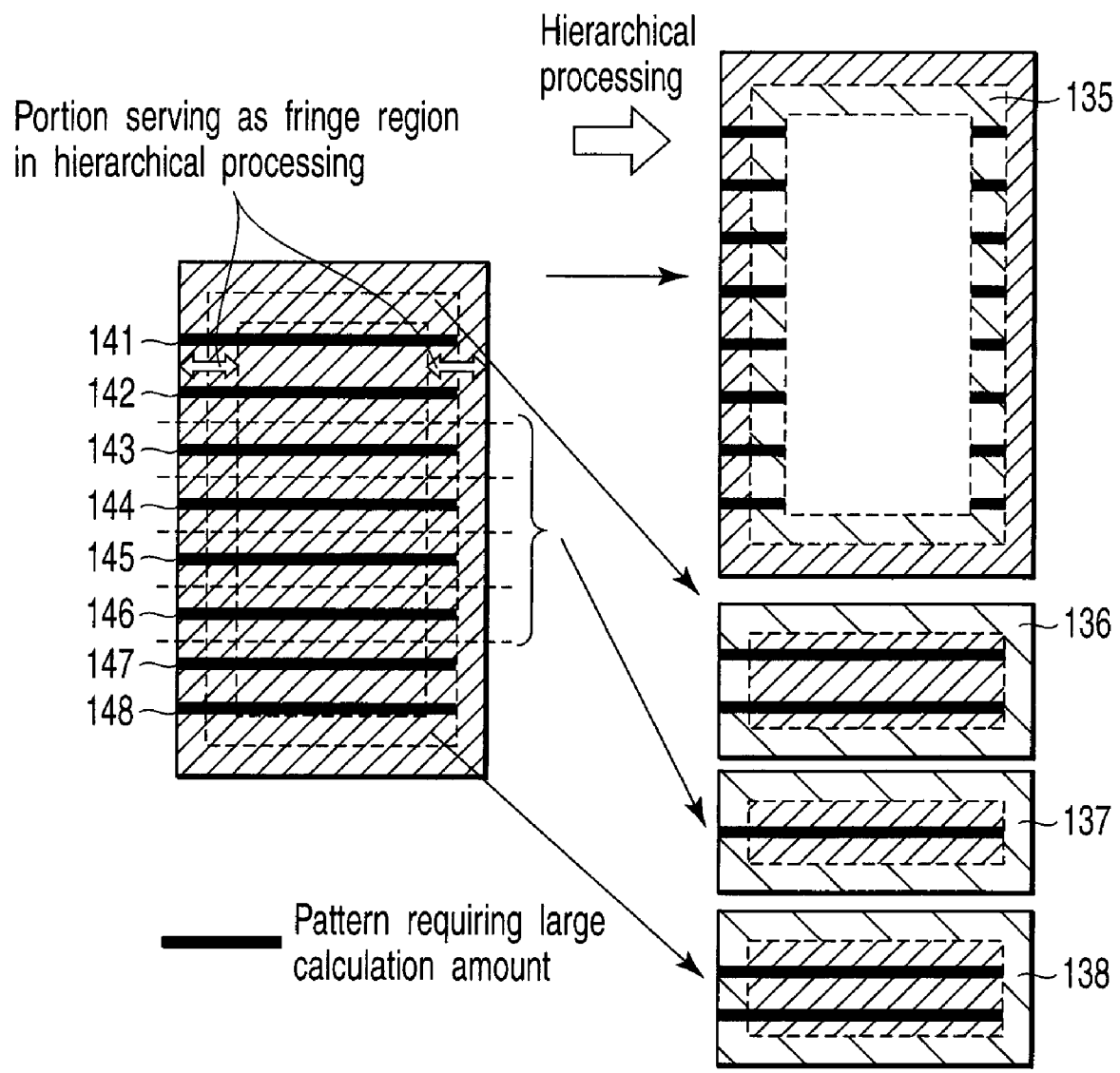
FIG. 14 is a view showing the original intermediate data in the hierarchical processing as the preprocessing of the mask data processing according to the third embodiment of the present invention.

In this embodiment, assume that, as shown in FIG. 14, patterns 141 to 148 requiring a large calculation amount in the mask data processing are arranged to overlap fringe regions 135 to 138 in the initial cell structure of the design data.

If intermediate data are formed by performing the hierarchical processing directly on this cell structure, as shown on the right side of FIG. 14, the calculation is repetitively performed in portions overlapping fringe regions 135 to 138. Consequently, an excess load is applied to the graphic operation, so a large calculation amount is necessary. Examples of patterns 141 to 148 having a large mask data processing calculation amount are patterns requiring the high-precision optical proximity correction (high-precision OPC).

In this embodiment, therefore, if it is found that the initial intermediate data require a large calculation amount as described above, the cell structure shown in FIG. 14 is reconstructed. That is, as shown in FIG. 15, the contours of the cells are enlarged such that patterns 141 to 148 requiring a large calculation amount in the mask data processing do not enter portions extending from the cell contours to the fringe regions.

Figure 15:
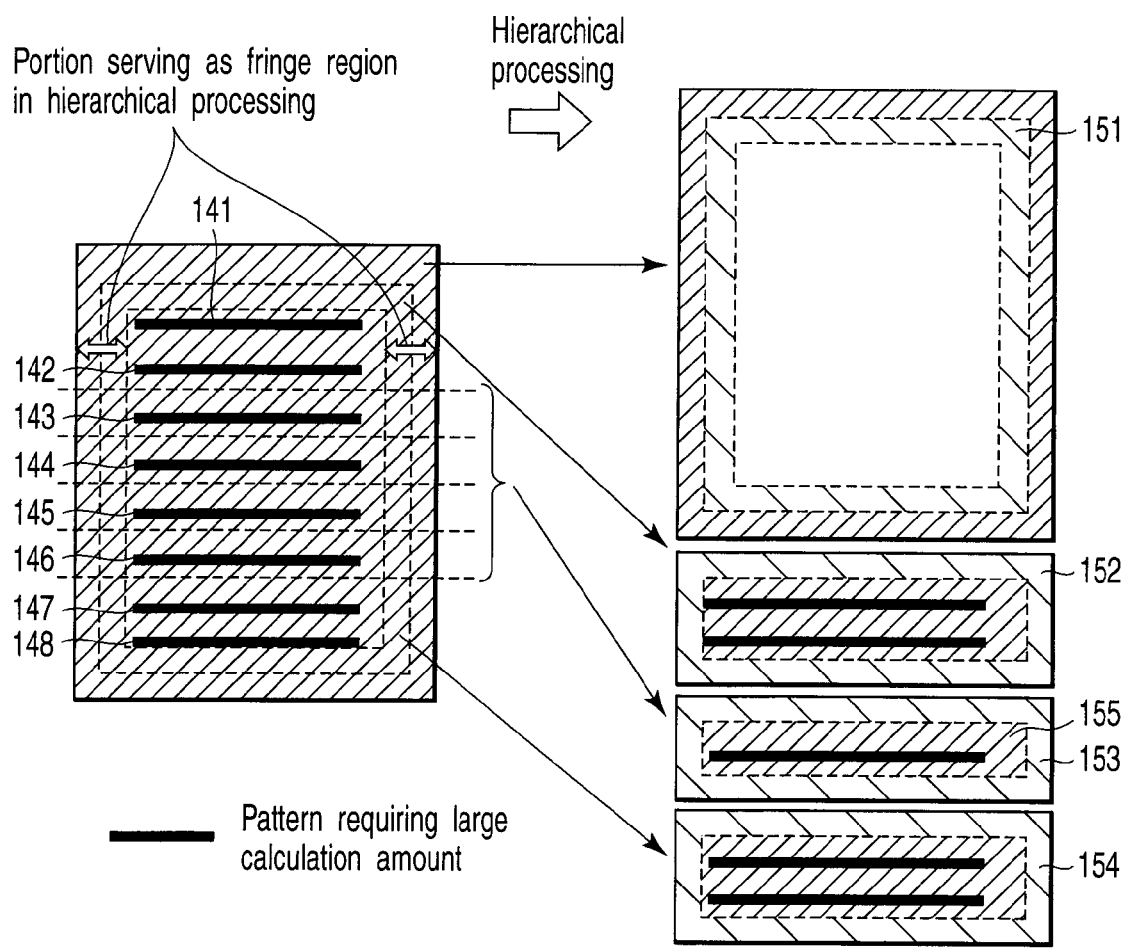
FIG. 15 is a view showing intermediate data after a cell is reconstructed in the hierarchical processing as the preprocessing of the mask data processing according to the third embodiment of the present invention.

Consequently, as shown on the right side of FIG. 15, patterns 141 to 148 requiring a large mask data processing calculation amount do not overlap fringe regions 151 to 154 in the intermediate data of the hierarchical processing, so no calculation is repetitively performed in each pattern. That is, the fringe regions are moved by changing the method of dividing the design data into a plurality of cells. As a result, the calculation amount in the mask data processing of changed fringe regions 151 to 154 can be made much smaller than that in the mask data processing of initial fringe regions 135 to 138.

Also, in patterns 143 to 146, the number of times of the calculation can be reduced by using the repetition of a cell 155. This makes it possible to reduce the calculation amount in the mask data processing.

In the mask data processing method according to this embodiment as explained above, the calculation amount in the mask data processing can be reduced by reconstructing the cells of the design data such that the fringe regions do not overlap patterns 141 to 148 requiring a large calculation amount in the mask data processing.

Note that the cell structure is reassembled in the hierarchical processing as the preprocessing of the mask data processing in the above explanation. However, the cell structure may also be reassembled in a design data correction step in a stage before the hierarchical processing. That is, the cell structure may also be reassembled by reassembling the hierarchical structure of the design data in, e.g., a design pattern correction tool 21 explained in the first embodiment.

Fourth Embodiment

A mask data processing method according to the fourth embodiment of the present invention will be explained below with reference to FIGS. 16 and 17.

Figure 16:
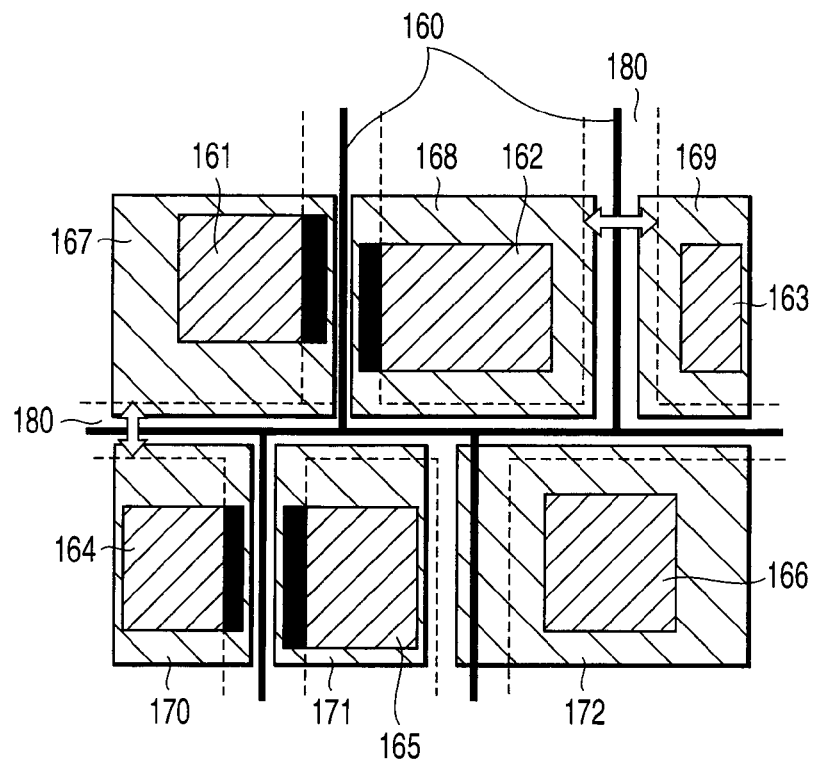
FIG. 16 is a view showing design data divided by the original cell structure in the fourth embodiment of the present invention.
Figure 17:
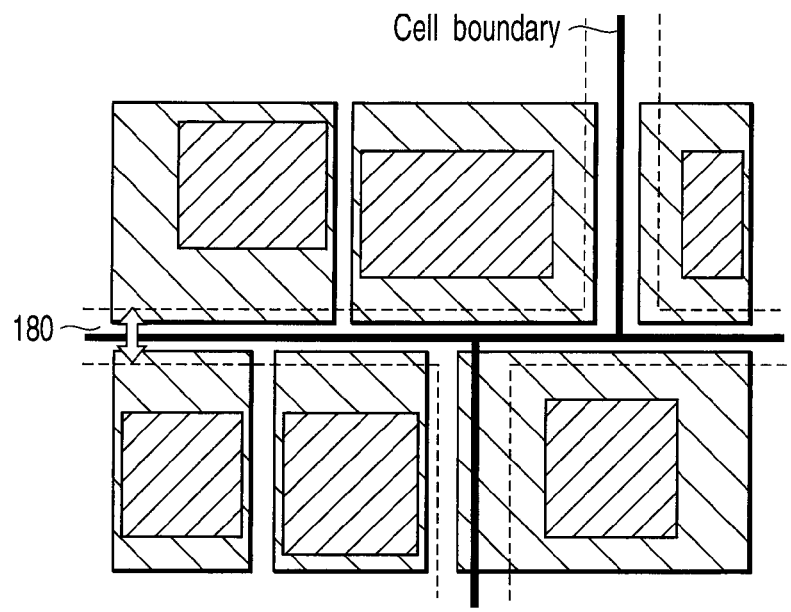
FIG. 17 is a view showing design data after the cell structure is reassembled in hierarchical processing as preprocessing of mask data processing according to the fourth embodiment of the present invention.

First, assume that the initial cell structure of design data is a cell structure divided by cell boundaries as shown in FIG. 16. Each of design patterns 161 to 166 is a graphic form or region requiring a large calculation amount in mask data processing, e.g., a pattern requiring high-precision optical proximity correction (high-precision OPC). Patterns 167 to 172 around the design patterns 161 to 166 are patterns requiring a mask data processing calculation amount much smaller than that of patterns 161 to 166.

As shown in FIG. 16, a region surrounded by the broken lines and having a predetermined width around the cell boundaries 160 as the centers is a fringe region 180 to be added to adjacent cells when it is divided into cells. As is apparent from FIG. 16, fringe region 180 contains solid regions of patterns 161, 162, 164, and 165 requiring a large calculation amount in the mask data processing. These regions require a large calculation amount because the calculation is repetitively performed in the mask data processing as described in the third embodiment as well.

In this embodiment, therefore, hierarchical processing as preprocessing of the mask data processing extracts, from the design layout, patterns 161 to 166 as graphic forms or regions requiring a large calculation amount in the mask data processing. Then, as shown in FIG. 17, the cell structure is reassembled by changing the cell boundaries so as to eliminate or reduce portions where fringe region 180 overlaps patterns 161 to 166 requiring a large calculation amount in intermediate data in the hierarchical processing.

That is, the cell division is changed by changing the cell boundaries so as to avoid the calculation from being repetitively executed by the hierarchical processing on the graphic form or region requiring a large calculation amount in the calculation of the mask data processing, thereby changing fringe region 180. Consequently, the calculation amount in the mask data processing of changed fringe region 180 can be made smaller than that of unchanged fringe region 180.

Note that the cell structure is reassembled in the hierarchical processing as the preprocessing of the mask data processing in the above explanation. However, the cell structure may also be reassembled in a design data correction step in a stage before the hierarchical processing. That is, the cell structure may also be reassembled by reassembling the hierarchical structure of the design data in, e.g., a design pattern correction tool 21 explained in the first embodiment.

Fifth Embodiment

A mask data processing method according to the fifth embodiment of the present invention will be explained below with reference to the accompanying drawing.

First, an example of optimization of the hierarchical structure of design data in the design stage will be explained with reference to a flowchart shown in FIG. 18.

First, as explained in FIG. 1, a mask data processing recipe 10 including sizing, roughness elimination, optical proximity correction, auxiliary pattern arrangement, and dummy pattern arrangement is input to a recommended cell structure calculator 11, and recommended cell structure indices 12 are output. On the basis of the recommended cell structure indices 12, the designer advances design to form one design data (block) (step S181).

A mask data processing test of emulating actual mask data processing (as a trial test) is conducted on this design data in accordance with the mask data processing recipe 10 (step S182), thereby analyzing how the data structure of design data having a hierarchical structure is expanded and processed in hierarchical processing as preprocessing of the mask data processing, and analyzing the calculation load in the mask data processing.

More specifically, in this embodiment, as in the first embodiment or the like, if a plurality of cells having the same design pattern are arranged in one direction the number of repetitions equal to or larger than B predetermined on the basis of the contents of the mask data processing, and the cell width in a direction perpendicular to the direction in which these cells are arranged is equal to or larger than A μm predetermined on the basis of the contents of the mask data processing, the hierarchical processing is performed such that the calculation of the mask data processing can be executed on only a design pattern contained in one of these cells.

An example of the analytical method in step S182 is a method of comparing the numbers of graphic forms, edge lengths, or the amounts of calculations to be executed of design patterns on which the calculation of the mask data processing is executed before and after the hierarchical processing, thereby determining whether the value becomes equal to or lager than a threshold value.

For example, assuming that the calculation of the mask data processing is directly executed on the hierarchical structure of the design data as shown in FIG. 4, the number of graphic forms of design patterns on which the calculation of the mask data processing is executed is a total of three, i.e., a line pattern 30 and critical cells 41 and 42. When the hierarchical processing is executed on this design data, however, as shown in FIG. 7, the line pattern 30 remains one pattern, but each of the critical cells 41 and 42 is completely expanded into six cells. Accordingly, the number of graphic forms of the design patterns on which the calculation is executed is 13.

If the threshold value is, e.g., 10, therefore, it is determined that the number of graphic forms of the design patterns on which the calculation is executed has exceeded the threshold value (step S183). Consequently, portions to be corrected, e.g., a portion that violates the recommended cell structure indices 12, and a portion where the calculation amount load is large and expansion presumably progresses in the hierarchical processing, are extracted from the structure of the design data with reference to the recommended cell structure indices 12 (step S184). The hierarchical structures of the design data in these portions are corrected in accordance with the recommended cell structure indices 12 in the same manner as in the first embodiment as shown in FIG. 5 (step S185).

The mask data processing test is performed again (step S182), and it is determined from the analysis of the process load that the calculation of the mask data processing is executed as shown in FIG. 6. That is, the number of graphic forms of the design patterns on which the calculation is executed is a total of seven, i.e., cells 50, 61, 62, 63, 64, 65, and 66, so it is determined that the number of graphic forms of the design patterns on which the calculation is executed is reduced to be smaller than 10 as the threshold value by correcting the hierarchical structure (step S183). As a consequence, the cell structure of the design data is regarded as having no problem, and the data is fixed and shipped (step S186). Note that the processes in steps S182 to S186 may also be implemented as functions of a design pattern correction tool 21 explained in the first embodiment.

The above explanation is made by taking the case that the number of graphic forms is an object of the threshold value determination as an example. However, it is also possible to assign a calculation amount to each graphic form, and perform the threshold value determination by the calculation amount. For example, assuming that the calculation amount of the line pattern 30 is 1 (an arbitrary unit), 1,000 is assigned as the calculation amount of critical cells 41 and 42, and 1,010 is assigned as the calculation amount of cells 61 to 66.

In this case, $1+1000 \times 2 = 2001$ in FIG. 4 before the hierarchical processing, $1+1000 \times 12 = 12001$ in FIG. 7 after the hierarchical processing, and $1+1010 \times 6 = 6061$ in FIG. 6 in which the hierarchical processing is performed on the corrected design data. If the threshold value is, e.g., 10,000, therefore, determination and design data correction similar to those explained above are executed.

It is also possible to use the expansion degree ((number of graphic forms to be processed)/(total number of graphic forms)) using the total number of graphic forms as the denominator and the number of graphic forms to be processed as the numerator in the threshold value determination. The total number of graphic forms when the cell hierarchical structure of the design data shown in FIG. 4 is entirely expanded is 100 line patterns 30+six critical cells 41+six critical cells 42=112. More specifically, the expansion degree is 3/112 in FIG. 4 before the hierarchical processing, 13/112 in FIG. 7 after the hierarchical processing, and 7/112 in FIG. 6 in which the hierarchical processing is performed on the corrected design data.

Furthermore, the threshold value determination may also be performed by assigning a weighted calculation amount to the unit length of the periphery of each graphic form. For example, a calculation amount of 1 (an arbitrary unit) is assigned per unit length to the peripheral length of the line pattern 30, and a calculation amount of, e.g., 1,000 is assigned per unit length to the peripheral length of the critical cells 41 and 42. The calculation amount of the mask data processing and the edge length are multiplied, and the product is used as a determination criterion.

In step S185 described above, the hierarchical structure of the design data is corrected in accordance with the recommended cell structure indices 12. However, it is also possible to present a plurality of candidates of the hierarchical structure of the corrected design data as shown in FIG. 5 or 9, and allow the user to select an optimum hierarchical structure or a hierarchical structure requiring a small calculation amount in accordance with the situation.

Figure 18:
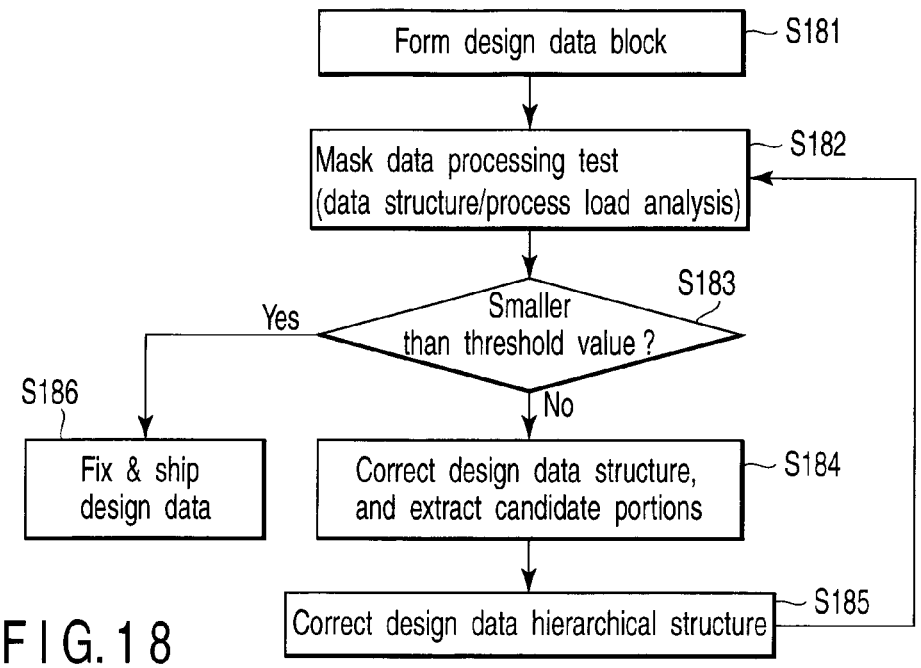
FIG. 18 is a flowchart showing a process of optimizing the hierarchical structure of design data in the design stage in the fifth embodiment of the present invention.

As an example of the optimization of the hierarchical structure of the design data in the design stage shown in the flowchart of FIG. 18, the mask data processing described in the third or fourth embodiment may also be executed by emulation in the design stage. In this case, the mask data processing shown in FIGS. 14 and 15 or 16 and 17 is emulated (as a simulation test) in step S182.

In the above explanation, the hierarchical structure of the design data is optimized in the design stage. As shown in a flowchart of FIG. 19, however, the hierarchical structure may also be optimized in a stage before the mask data processing after the design data is formed and shipped (step S191).

First, analysis is performed in accordance with the mask data processing recipe 10 in this case as well to determine how the data structure of design data having a hierarchical structure is expanded and processed in the hierarchical processing as the preprocessing of the mask data processing, and analyze the calculation load in the mask data processing (step S192).

Then, threshold value determination as explained above is executed (step S193), and a portion having a value equal to or larger than the threshold value is extracted from the hierarchical structure of the cell (step S194). After the hierarchical structure of the cell is corrected (step S195), the mask data processing is executed (step S196). If the value is smaller than the threshold value in the threshold value determination (step S193), the shipped design data directly undergoes the mask data processing (step S196).

As has been explained above, the calculation amount in the mask data processing can be reduced, without any adverse effect on the mask pattern shape, by reassembling the hierarchical structure of design pattern data of a semiconductor integrated circuit into a structure that the mask data processing tool can efficiently process.

Accordingly, the mask data processing methods according to the first to fifth embodiments described above make it possible to save the machine resources for the mask data processing, and shorten the turn around time of mask data formation. Consequently, the fabrication cost of a semiconductor device can be reduced by making a photomask by any of the mask data processing methods explained above, and fabricating the semiconductor device by using the photomask.

Figure 20:
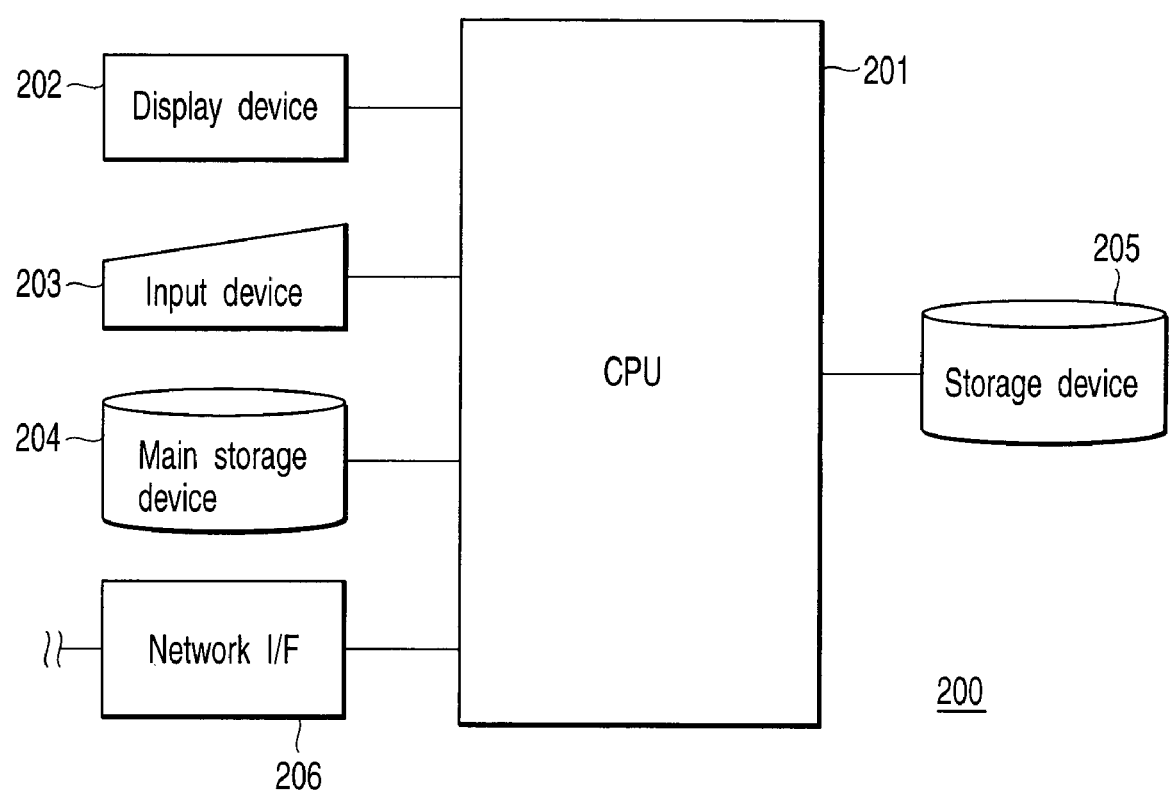
FIG. 20 is a block diagram showing the configuration of a computer system for implementing the mask data processing method of the embodiment.

Also, the mask data processing methods explained in the first to fifth embodiments can be implemented in a computer system 200 comprising a CPU 201, a display device 202 such as a display, an input device 203, a main storage device 204 (a main memory), and a storage device 205 such as a hard disk as shown in FIG. 20.

In this case, the CPU 201 implements the mask data processing method by executing a program stored in the storage device 205. The storage device 205 can also store the contents of the mask data processing recipe 10, and a program for implementing the recommended cell structure calculator 11. The storage device 205 also stores the recommended cell structure indices 12 output by the program for implementing the recommended cell structure calculator 11 on the basis of the mask data processing recipe 10.

Furthermore, the storage device 205 stores, e.g., a data analytical program that executes data structure analysis, process load analysis, analytical result determination, and the like, a data structure (cell structure) correction program that extracts correction candidates of a design data structure (cell structure) and corrects the design data structure (cell structure), and graphic data.

Figure 19:
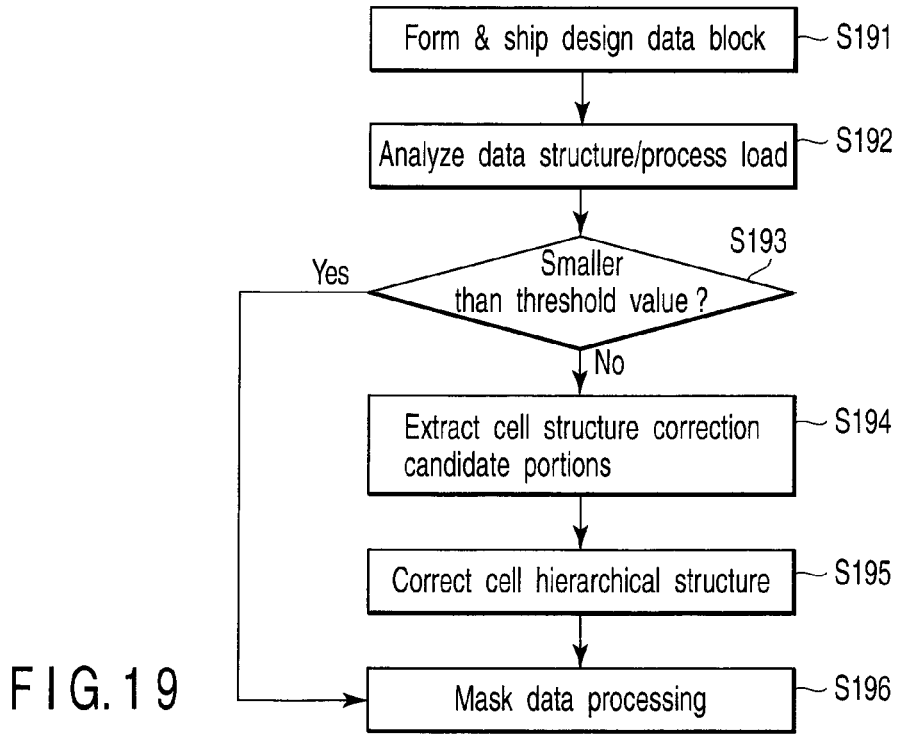
FIG. 19 is a flowchart showing a process of optimizing the hierarchical structure in a stage before mask data processing in the fifth embodiment of the present invention.

The CPU 201 executes the mask data processing based on the flowchart shown in FIG. 18 or 19 by using these programs and data. The analytical results of the above-mentioned data analytical program may also be stored in the storage device 205. The storage device 205 may also physically comprise a plurality of storage devices each of which is assigned a role corresponding to the function.

As described above, according to one aspect of this invention, it is possible to provide a mask data processing method capable of saving the machine resources by reducing the calculation amount in the mask data processing of a semiconductor integrated circuit, and also capable of shortening the turn around time, a semiconductor device fabrication method using a mask formed by the mask data processing method, and a medium storing a program for allowing a computer to execute the mask data processing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask data processing method for generating mask data related to design data having a hierarchical data structure using a computer, the method comprising:
    forming the hierarchical data structure, the hierarchical data structure including cells blocks defined by the design data including patterns and critical cell patterns, the critical cell patterns having a width smaller than a predetermined value, and a number of repetitions of the patterns and critical cell patterns;
    correcting the design data to create corrected design data, the corrected design data including at least one new cell block including at least one of the cell blocks based on recommended cell structure indices, the indices being a value greater than or equal to the width of the critical cell pattern and a number of repetitions of a cell forming a part of at least one cell block;
    restructuring the hierarchical data structure based on corrected design data including the at least one new cell block;
    wherein restructuring the hierarchical data structure further includes restructuring based on the number of different patterns and critical cell patterns included in the design data, a total edge length of repeated cell blocks on an edge along the repeated cell blocks included in the design data, a calculation amount associated with the critical cell patterns, or an expansion degree of the at least one new cell block, using a hierarchical data structure correction program stored in a memory in the computer.

2. The mask data processing method according to claim 1, wherein before said restructuring, the design data includes a repetition of the same patterns or critical cell patterns.

3. The mask data processing method according to claim 1, wherein the design data having the hierarchical data structure has a width as viewed in a direction perpendicular to a repeating direction in which the design data repeats.

4. The mask data processing method according to claim 1, wherein during said restructuring, the design data includes a design data region having elements other than a cell.

5. The mask data processing method according to claim 1, wherein during said restructuring, the design data includes a dummy pattern.

* * * * *

UNITED STATES PATENT AND TRADEMARK OFFICE
CERTIFICATE OF CORRECTION

| | | |
|---|---|---|
| PATENT NO. | : 7,996,794 B2 | |
| APPLICATION NO. | : 11/945697 | |
| DATED | : August 9, 2011 | |
| INVENTOR(S) | : Kobayashi et al. | |

It is certified that error appears in the above-identified patent and that said Letters Patent is hereby corrected as shown below:

Claim 1, column 13, line 25, change "cells blocks" to --cell blocks--.

Signed and Sealed this
Sixth Day of December, 2011

David J. Kappos
*Director of the United States Patent and Trademark Office*